US006611544B1

(12) United States Patent
Jiang et al.

(10) Patent No.: US 6,611,544 B1
(45) Date of Patent: Aug. 26, 2003

(54) METHOD AND APPARATUS FOR NARROW BANDWIDTH DISTRIBUTED BRAGG REFLECTOR SEMICONDUCTOR LASERS

(75) Inventors: Wenbin Jiang, Thousand Oaks, CA (US); Dan Dapkus, Fullerton, CA (US); Hsing-Chung Lee, Calabasas, CA (US)

(73) Assignee: E20 Communications, Inc., Calabasas, CA (US)

( * ) Notice: Subject to any disclaimer, the term of this patent is extended or adjusted under 35 U.S.C. 154(b) by 0 days.

(21) Appl. No.: 09/547,172

(22) Filed: Apr. 11, 2000

(51) Int. Cl.$^7$ ............................................... H01S 5/026
(52) U.S. Cl. ........................................... 372/50; 372/96
(58) Field of Search ..................................... 372/50, 96

(56) References Cited

U.S. PATENT DOCUMENTS

| | | |
|---|---|---|
| 4,704,720 A | 11/1987 | Yamaguchi |
| 4,786,132 A | 11/1988 | Gordon |
| 4,852,116 A | 7/1989 | Takiguchi et al. |
| 4,856,017 A | 8/1989 | Ungar |
| 5,091,916 A | 2/1992 | Cimini, Jr. et al. |
| 5,271,030 A | 12/1993 | Chinen |
| 5,363,399 A | 11/1994 | Yagi |
| 5,485,481 A | 1/1996 | Ventrudo et al. |
| 5,537,432 A | 7/1996 | Mehuys et al. |
| 5,727,013 A | 3/1998 | Botez et al. |
| 5,832,011 A | 11/1998 | Kashyap |
| 6,018,534 A | 1/2000 | Pan et al. |
| 6,055,262 A | 4/2000 | Cox et al. |
| 6,088,376 A | 7/2000 | O'Brien et al. |
| 6,160,828 A | 12/2000 | Kozlov et al. |
| 6,160,833 A | 12/2000 | Floyd et al. |
| 6,339,607 B1 | 1/2002 | Jiang et al. |
| 6,424,669 B1 | 7/2002 | Jiang et al. |

OTHER PUBLICATIONS

Yuasa, et al., Surface–emitting GaAs/AIGaAs Multi–Quantum Well Lasers with Optical Bistability, #W06, Conference on Lasers and Elector–Optics, Anaheim, CA, Apr. 27, 1988.
Wu, et al., Surface–emitting Laser Diode with Bent Double Heterostructure, #WG4, Conference on Lasers and Elector–Optics, Anaheim, CA, Apr. 28, 1988.
Nam, et al., High–Power CW Monolithic 2–D Arrays of Surface–Emitting Lasers, #CWN8, Conference on Lasers and Elector–Optics, May 13, 1992.
Eli Kapon, Semiconductor Lasers II Materials and Structures, Chapter 5.2.5 Folded Cavity Semiconductor Lasers, pp. 328–329, Academic Press, 1999 (no month).

*Primary Examiner*—James Davie
(74) *Attorney, Agent, or Firm*—Blakely Sokoloff Taylor & Zafman

(57) ABSTRACT

Semiconductor lasers having a narrow bandwidth distributed Bragg reflector (DBR). The narrow bandwidth distributed Bragg reflector reflects photons over a narrow wavelength range for amplification within the laser cavity. Photons outside the narrow wavelength range are not reflected back into the laser cavity and are therefore not amplified. The narrow bandwidth distributed Bragg reflector can be formed of semiconductor materials or dielectric materials. The narrow bandwidth distributed Bragg reflector is included as part of folded cavity surface emitting lasers and edge emitting lasers. Photons within the narrow wavelength range of the narrow bandwidth distributed Bragg reflector reflects are of a relatively long wavelength to improve efficiency of communication over fiber optic cables.

81 Claims, 5 Drawing Sheets

| Layer | Thickness (nm) |
|-------|----------------|
| SiO2  | 229.1 |
| SiNO2 | 267.4 |
| SiO2  | 309.5 |
| SiNO2 | 178.7 |
| SiO2  | 446.5 |
| SiNO2 | 168.5 |
| SiO2  | 394.5 |
| SiNO2 | 271.4 |
| SiO2  | 196.0 |
| SiNO2 | 148.3 |
| SiO2  | 207.3 |
| SiNO2 | 29.0 |
| SiO2  | 217.6 |
| SiNO2 | 130.4 |
| SiO2  | 170.8 |
| SiNO2 | 156.1 |
| SiO2  | 352.5 |
| SiNO2 | 194.4 |
| SiO2  | 384.7 |
| SiNO2 | 160.9 |
| SiO2  | 590.3 |
| SiNO2 | 205.9 |
| SiO2  | 362.4 |
| SiNO2 | 216.4 |
| SiO2  | 272.8 |
| SiNO2 | 152.9 |
| SiO2  | 427.2 |

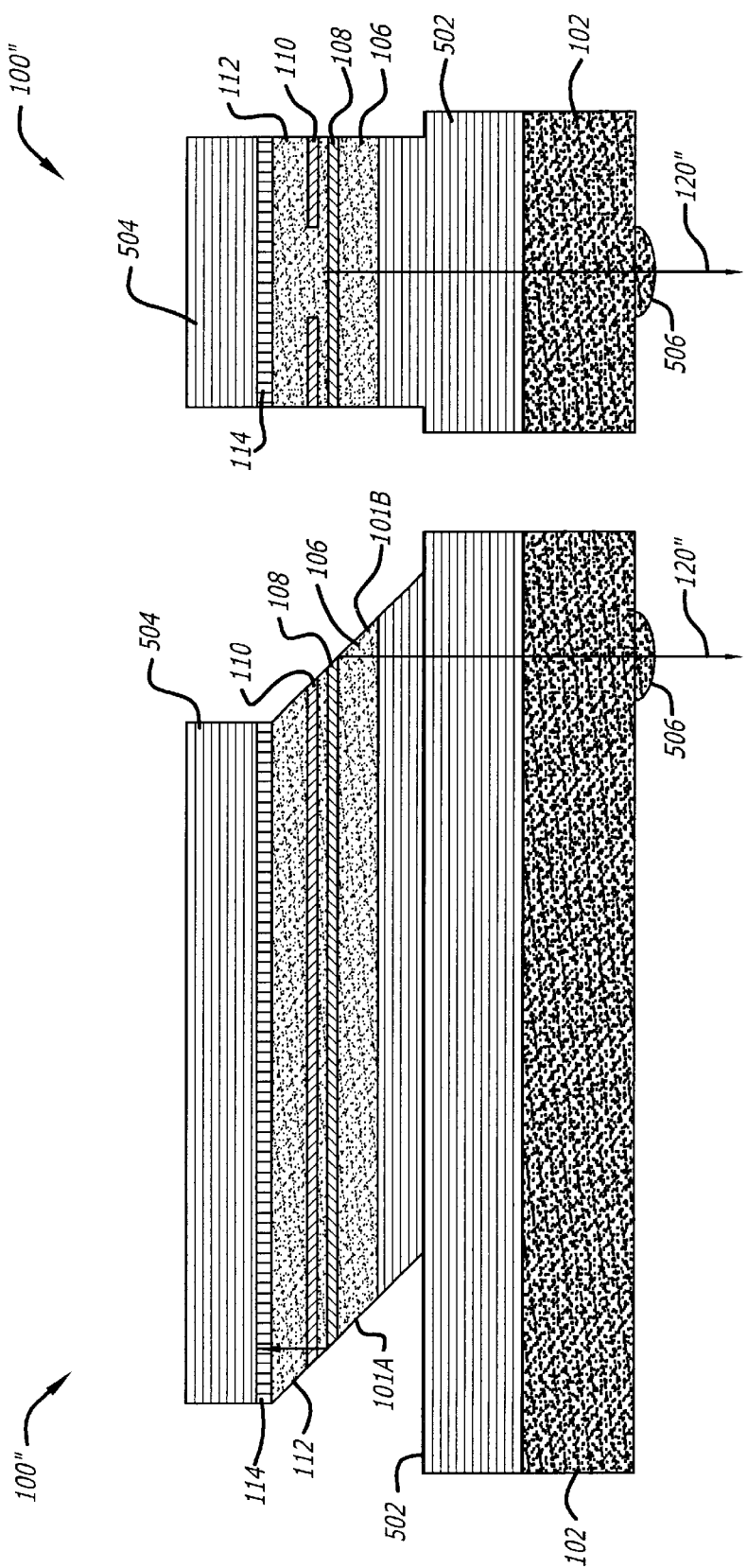

METHOD AND APPARATUS FOR NARROW BANDWIDTH DISTRIBUTED BRAGG REFLECTOR SEMICONDUCTOR LASERS

FIELD OF THE INVENTION

The invention relates generally to semiconductor lasers. More particularly, the invention relates to semiconductor lasers having a narrow bandwidth distributed Bragg reflector (DBR).

The present invention relates generally to semiconductor lasers. More particularly, the present invention relates to folded cavity surface emitting lasers (FCSELs) and edge emitting semiconductor lasers.

BACKGROUND OF THE INVENTION

Semiconductor lasers have become more important. One of the most important applications of semiconductor lasers is in communication systems where fiber optic communication media is employed. With growth in electronic communication, communication speed has become more important in order to increase data bandwidth in electronic communication systems. Improved semiconductor lasers can play a vital roll in increasing data bandwidth in communication systems using fiber optic communication media such as local area networks (LANs), metropolitan area networks (MANs) and wide area networks (WANs). A preferred component for optical interconnection of electronic components and systems via optical fibers is a semiconductor laser. Semiconductor lasers are generally lower in cost, consume less power and typically require a fraction of the space than other types of lasers. Due to optical properties of optical fibers, photons emitted at longer wavelengths from a laser tend to propagate longer distances and are less disturbed by optical noise sources. Thus, forming a semiconductor laser that can operate at longer wavelengths, such as a wavelength greater than 1.25 microns (um) or 1250 nanometers (nm), is desirable.

Additionally, single mode operation of a semiconductor laser is required for optical communications relying on a single mode fiber as a transmission medium. A semiconductor laser using distributed feedback, oftentimes referred to as a distributed feedback laser (DFB), is one commonly used technology to achieve single narrow line-width operation at either 1.3 um or 1.55 um wavelength range. However, DFB laser fabrication requires re-growth and cleaving. It is therefore intrinsically a low volume, low yield and high cost manufacturing technology.

A vertical cavity surface emitting laser (VCSEL) is a low cost approach to achieve DFB-like single mode operation and is a mature technology for lasing at a 850 nm wavelength. However, long wavelength VCSELs in the range of 1.3 um to 1.55 um have not yet reached performances needed in commercial applications for a number of reasons.

It is desirable to overcome the limitations of the prior art.

BRIEF SUMMARY OF THE INVENTION

Briefly, the present invention includes a method, apparatus and system as described in the claims.

Semiconductor lasers are disclosed having a narrow bandwidth distributed Bragg reflector (DBR). The narrow bandwidth distributed Bragg reflector reflects photons over a narrow wavelength range and does not reflect photons outside the narrow wavelength range back into the laser cavity for amplification. The narrow bandwidth distributed Bragg reflector can be formed of semiconductor materials or dielectric materials. The narrow bandwidth distributed Bragg reflector is included as part of folded cavity surface emitting lasers and edge emitting lasers. Photons within the narrow wavelength range of the narrow bandwidth distributed Bragg reflector reflects are of a relatively long wavelength to improve efficiency of communication over fiber optic cables.

A number of embodiments are disclosed.

BRIEF DESCRIPTIONS OF THE DRAWINGS

FIG. 5A is a magnified cross sectional side view of a third embodiment of a DBR FCSEL of the present invention.

FIG. 5B is a magnified cross-sectional front view of the third embodiment of the DBR FCSEL of the present invention.

Like reference numbers and designations in the drawings indicate like elements providing similar functionality.

DETAILED DESCRIPTION OF THE PREFERRED EMBODIMENT

In the following detailed description of the present invention, numerous specific details are set forth in order to provide a thorough understanding of the present invention. However, it will be obvious to one skilled in the art that the present invention may be practiced without these specific details. In other instances well known methods, procedures, components, and circuits have not been described in detail so as not to unnecessarily obscure aspects of the present invention.

The present invention provides a long wavelength semiconductor laser that has the performance of a distributed feedback (DFB) laser but is fabricated and tested similar to vertical cavity surface emitting lasers (VCSELs). A folded cavity surface emitting laser (FCSEL) integrated with a narrow bandwidth distributed Bragg reflector (DBR) is provided. The narrow bandwidth DBR can be formed out of either semiconductor materials or dielectric materials and if formed of semiconductor materials, can be monolithically grown with the FCSEL. The narrow bandwidth DBR is formed of materials and thicknesses of materials to be highly reflective in a very narrow bandwidth range. The high reflectivity in the narrow bandwidth range provides sufficient feedback for a desired center lasing wavelength while avoiding the reflection of other wavelengths back into the laser cavity and thereby allows only a single wavelength to be emitted from the laser. Oxide confinement may be used to laterally confine the current injection and transverse optical mode so that the laser will also operate single mode spatially.

The narrow bandwidth DBR FCSEL has two 45-deg angled facets to form the folded cavity surface emitting laser with a top surface acting as an output mirror and the bottom narrow bandwidth DBR acting as a highly reflective end mirror. The two angled facets deflect the beam in the laser cavity up and down to complete the laser cavity. Due to the highly reflective narrow bandwidth DBR, the laser is selected to operate only at a wavelength within the DBR reflective band. If the bandwidth is narrow enough relative to the cavity resonant modes, only one cavity mode can be amplified to overcome the cavity loss and the FCSEL will operate at this single longitudinal mode. The laser transverse mode may operate at fundamental mode by controlling the laser stripe width or lateral oxidation depth of the confinement layer.

Figures 1A, 1B:
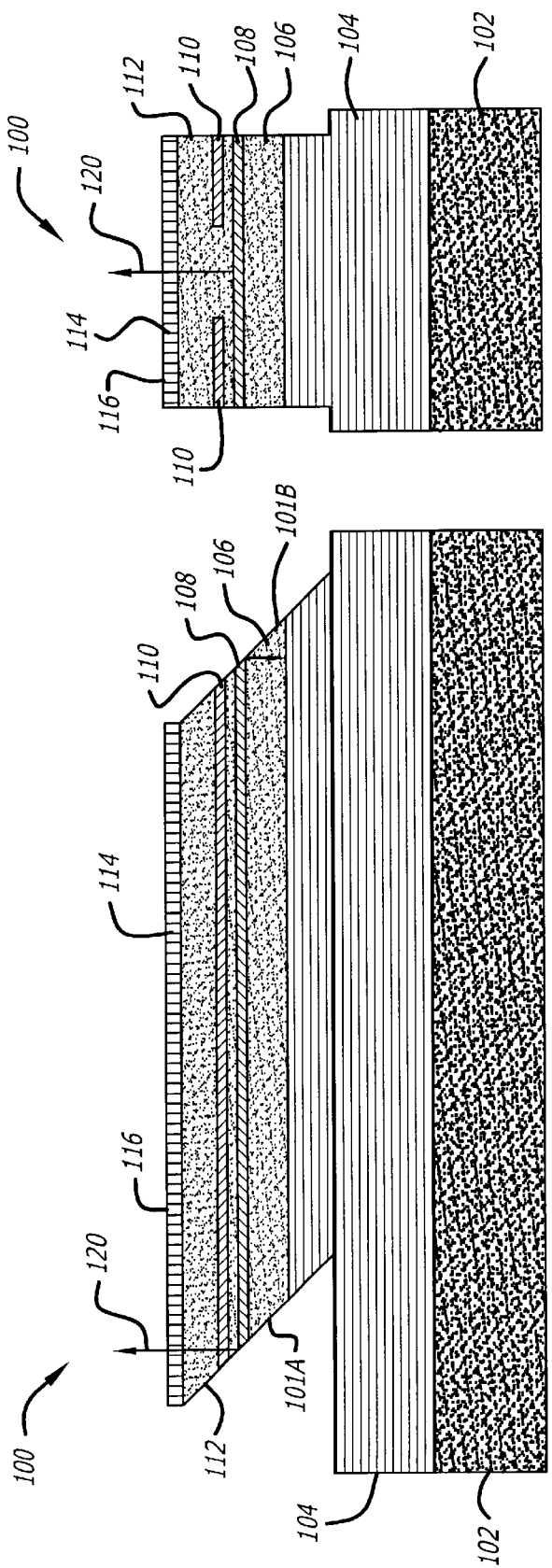
FIG. 1A is a magnified cross-sectional side view of a first embodiment of a DBR FCSEL of the present invention.
FIG. 1B is a magnified cross-sectional front view of the first embodiment of the DBR FCSEL of the present invention.

Referring now to FIGS. 1A and 1B, a first embodiment of the distributed Bragg reflector (DBR) folded cavity surface emitting laser (FCSEL) 100 of the present invention is illustrated. FCSEL 100 is an electrically pumped semiconductor laser which has a folded laser cavity provided by a pair facets (also referred to as reflectors or beam steering elements) 101A and 101B at opposite ends. Preferably the external-angled beam steering element 101B and the internal-angled beam steering element 101A are approximately forty five degree angles with the incident light to form the folded cavity of the folded cavity surface emitting laser 100. The beam steering elements 101A and 101B are preferably parallel to each other and formed by cleaving, etching, ion milling or other well known semiconductor process of the semiconductor layers shown in FIG. 1A forming the DBR FCSEL 100. A dielectric coating (not shown) may be added to the facets 101A and 101B to act as a mirror coating to increase the reflectivity efficiency or as a surface passivation.

The DBR FCSEL 100 further includes a substrate 102, a narrow bandwidth distributed Bragg reflector (DBR) mirror 104, a first cladding layer 106, an active region 108, a confinement layer 110, a second cladding layer 112 and a top contact layer 114.

Figures 2, 3:
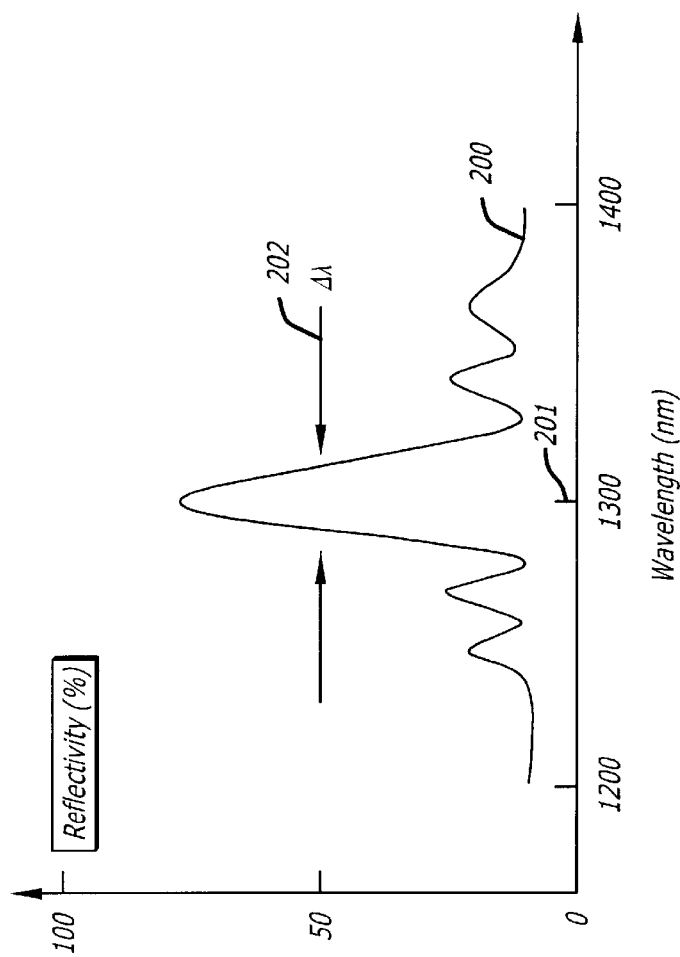
FIG. 2 is a graph of the reflectivity response of a narrow bandwidth DBR for the DBR FCSEL of the present invention.
FIG. 3 is an exemplary embodiment of the narrow bandwidth DBR for the DBR FCSEL of the present invention.

The narrow bandwidth distributed Bragg reflector (DBR) 104 couples to substrate 102. In one embodiment of the DBR FCSEL 100, substrate 102 is an n-type doped Indium-Phosphide (InP) substrate with an Indium-Gallium-Arsenide-Phosphide/Indium-Phosphide (InGaAsP/InP) distributed Bragg Reflector (DBR) 104 deposited or monolithically grown onto the substrate. The narrow-bandwidth DBR 104 has a narrow reflective bandwidth around a desired center wavelength such as that shown in FIG. 2. The narrow bandwidth DBR 104 is doped to match the substrate 102 and in the case that the substrate 102 is an n-type doped Indium-Phosphide (InP) substrate, the DBR 104 is n-type doped as well. Alternatively, an Indium-Aluminum-Gallium-Arsenide[-Phosphide]/Indium-Phosphide (InAlGaAs/InP) distributed Bragg Reflector (DBR) or other monolithic grown DBR mirror having a narrow bandwidth response such as shown in FIG. 2 can be grown onto the substrate 102. If wafer bonding techniques are used, a Gallium-Arsenide/Aluminum-Gallium-Arsenide (GaAs/AlGaAs) distributed Bragg Reflector (DBR) or a dielectric DBR having a narrow bandwidth response such as shown in FIG. 2 can be bonded onto the active layers including layers 106, 108, 110 and 112. In the case of wafer bonding, the substrate 102 is preferably GaAs. Exemplary dielectric materials for a dielectric DBR include titanium di-oxide ($TiO_2$), silicon dioxide ($SiO_2$), and silicon nitrogen di-oxide ($SiNO_2$).

The first cladding layer 106 is Indium-Gallium-Arsenide-Phosphide (InGaAsP) in one embodiment. The portion of the cladding layer 106 close to the DBR 104 is doped to be an n-type semiconductor to provide better electrical conductivity. The first cladding layer 106 is formed to have a bandgap wider than the active region 108.

The active region 108 consists of a single or multiple quantum well structure. The quantum wells are formed of layers of Indium-Gallium-Arsenide-Phosphide (InGaAsP) and Indium-Phosphide (InP) having a composition to lase at the desired center wavelength. In the preferred embodiment the quantum well bandgap is adjusted to lase at a center wavelength of 1.3 um and the quantum barriers which are formed of Indium-Gallium-Arsenide-Phosphide (InGaAsP) are adjusted to have a bandgap over the range of 1.10 um to 1.20 um. The quantum wells in the active region 108 may also consist of layers of Indium-Aluminum-Gallium-Arsenide (InAlGaAs) and Indium-Phosphide (InP) having a composition to lase at the desired center wavelength of 1.3 um in the preferred embodiment. The thickness of materials and choice of materials can be varied to provide for a desired center wavelength of 1.55 um. The second cladding layer 112 is Indium-Gallium-Arsenide-Phosphide (InGaAsP). The portion of the cladding layer 112 close to the active region 108 is undoped while the portion closer to the contact layer 114 is doped to be a p-type semiconductor to provide better electrical conductivity with the contact layer 114. The second cladding layer 112 is also formed to have a bandgap wider than the active region 108.

The second cladding layer 112 includes the confinement layer 110 as shown. The confinement layer 110 is preferably a strained Indium-Aluminum-Arsenide (InAlAs) layer. The strained Indium-Aluminum-Arsenide (InAlAs) layer is formed within a part of the second cladding 112 to allow lateral oxidation during device fabrication. The confinement layer 110 provides both current confinement and optical confinement for the DBR FCSEL 100. Referring to Figure 1B, the confinement layer 110 is oxidized to form a narrow conductive stripe above the active region 108 as illustrated.

The top contact layer 114 is provided so as to make an ohmic contact to a first metal layer (not shown) deposited on its top surface to form the first terminal of the DBR FCSEL. The first metal layer is not deposited in the area where photons are emitted. The top contact layer 114 is preferably an Indium-Gallium-Arsenide-Phosphide (InGaAsP) layer highly doped to be p-type semiconductor so as to provide an ohmic contact. A second metal layer (not shown) is deposited on the bottom surface of the substrate 102 in order to form the second terminal of the DBR FCSEL 100.

To manufacture the DBR FCSEL 100, the layers of materials are deposited or grown from the beginning layer of the substrate 102. After forming a monolithic structure consisting of the substrate 102, the narrow bandwidth DBR 104, the first cladding layer 106, the active region 108, the second cladding layer 112 with the confinement layer 110, and the top contact layer 114, the facets 101A and 101B can be formed. The facets 101A and 101B are formed by cleaving, etching, ion milling or other semiconductor process to remove material from the front and back of the top contact layer 114, the second cladding layer 112 with the confinement layer 110, the active region 108, the first cladding layer 106 and a top portion of the narrow bandwidth DBR 104. A lower portion of the narrow bandwidth DBR 104 can be removed as shown but does not have to be removed and none of the substrate 102 need be removed in forming the facets 101A and 101B.

In operation, the DBR FCSEL 100 generates a laser beam which is reflected between the beam steering element 101A, beam steering element 101B, narrow bandwidth DBR 104, and the top contact layer 114. The interface 116 between the air and the top contact layer 114 acts as an output mirror and the narrow bandwidth DBR 104 acts as a highly reflective end mirror for the DBR FCSEL 100. The two angled facets 101A and 101B deflect the beam within the laser cavity of the active region 108 to amplify the energy and stimulate emission of photons. Facet 101A functions as a total reflector to steer photons 120 into the active region 108 for gain and toward interface 116 through the second cladding layer 112 and the top contact layer 114 to be emitted out of the top of the DBR FCSEL 100.

Referring now to FIG. 2, a reflectivity response 200 for the ideal narrow bandwidth DBR 104 is illustrated. The reflectivity response is plotted as a percentage of reflectivity as a function of the wavelength of the incident photons. The ideal narrow bandwidth DBR 104 is highly reflective for amplification in laser cavity of the active region 108 around a desired center wavelength 201 over a narrow wavelength range 202. Outside the narrow wavelength range 202, the narrow bandwidth DBR 104 is transmissive and does not reflect photons having these energies back into the laser cavity. Therefore, photons having wavelengths outside the narrow wavelength range 202 are not amplified in the laser cavity of the active region 108 and are therefore not emitted by the semiconductor laser. The function of the narrow bandwidth DBR can be analogized to dampening out photons having wavelengths outside the narrow wavelength range 202 while amplifying photons having wavelengths within the narrow wavelength range 202. The narrow wavelength range 202 of the narrow bandwidth DBR is sufficiently narrow to reflect a single mode wavelength for lasing. Essentially, the narrow bandwidth DBR selects a wavelength of photons within the narrow wavelength range 202 for reflection into the active region 108 of the semiconductor laser. The bandwidth of the narrow wavelength range 202 is less than or equal to the cavity resonant mode spacing. Semiconductor lasers are formed of a Fabry-Perot cavity, which can only support wavelengths in resonance with the cavity. Assuming the cavity length is L, the effective material index is n, and the wavelength supported is $\lambda_m$, then $2nL = m\lambda_m$, where m in an integer number (i.e., m=1, 2, 3, . . . ). Therefore, many $\lambda_m$ (called modes) spaced by $\delta\lambda = \lambda_m - \lambda_{m-1}$ are supported in the laser cavity. This $\delta\lambda$ is called mode spacing. If $\delta\lambda$ is larger than the bandwidth of the narrow wavelength range 202 for DBR 104, there can be only one mode sitting within the high reflective band of the narrow wavelength range 202. This mode will be reflected into the laser cavity and get amplified, if the mode also happens to be supported by the active gain medium. All other modes will be suppressed as they are not in the bandwidth of the narrow wavelength range 202.

An approximation for the narrow wavelength range 202 is less than 20 nanometers (nm) and preferably less than 10 nm. As an example, for a center wavelength of 1300 nm the narrow wavelength range 202 is from approximately 1295 nm to approximately 1305 nm, and for a center wavelength of 1550 nanometers (nm) the narrow wavelength range 202 is from approximately 1545 nanometers (nm) to approximately 1555 nm. The reflectivity response curve over the narrow wavelength range 202 has an approximate reflectivity percentage of greater than fifty percent. Using various dielectric materials and thicknesses thereof, embodiments of the ideal narrow bandwidth DBR 104 may be obtained substantially having the reflectivity response of FIG. 2. Due to the high reflectivity of narrow bandwidth DBR 104 over the narrow wavelength range 202, the DBR FCSEL 100 need only be designed to operate at a wavelength within the narrow wavelength range 202. If the bandwidth of the narrow wavelength range 202 is narrow enough relative to the cavity resonant modes, only one cavity mode is amplified to overcome the cavity loss and the DBR FCSEL 100 operates at this single longitudinal mode. The transverse mode of the DBR FCSEL 100 may operate at a fundamental mode by controlling the laser stripe width (i.e., mesa ridge width) or the lateral oxidation depth of the confinement layer 110 into the mesa.

Referring now to FIG. 3, one embodiment of an exemplary narrow bandwidth DBR 104' is illustrated. The narrow bandwidth DBR 104' has alternating layers of dielectric materials as shown having the approximate thicknesses listed next to each. The layers of materials are pairs of dielectric materials having different indexes of refraction of varying thickness. One example is to use silicon di-oxide ($SiO_2$) and titanium di-oxide ($TiO_2$) Another example is to use silicon di-oxide ($SiO_2$) and silicon nitride di-oxide ($SiNO_2$). Yet another example of a narrow bandwidth DBR combines these pairs of materials. Other pairs of dielectric materials and thicknesses may be used provided there is sufficient difference in indexes of refraction between them. In FIG. 3, the pairs of silicon di-oxide ($SiO_2$) and silicon nitride di-oxide ($SiNO_2$) materials and thickness thereof as shown, provide an exemplary embodiment of a narrow bandwidth DBR 104' that substantially has the reflectivity response illustrated in FIG. 2. The narrow bandwidth distributed Bragg reflector 104 can also be a semiconductor distributed Bragg reflector formed of pairs of semiconductor materials such as InGaAsP/InP, InAlGaAs/InP, GaAs/GaAlAs. In the case of a semiconductor DBR, the semiconductor materials can be monolithically grown. In the case of a dielectric DBR, the dielectric materials require depositing or evaporating.

Figures 4A, 4B:
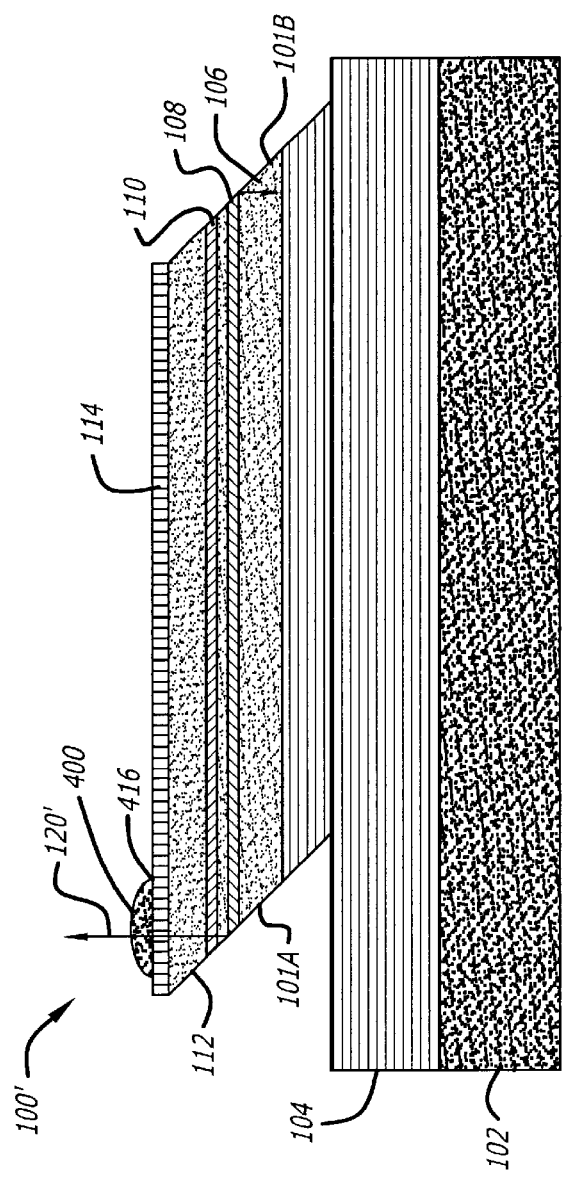
FIG. 4A is a magnified cross sectional side view of a second embodiment of a DBR FCSEL of the present invention.
FIG. 4B is a magnified cross-sectional front view of the second embodiment of the DBR FCSEL of the present invention.

Referring now to FIGS. 4A and 4B, a DBR FCSEL 100', a second embodiment of the present invention is illustrated. DBR FCSEL 100' includes the elements of the first embodiment, DBR FCSEL 100, including the beam steering elements 101A and 101B, the substrate 102, the narrow bandwidth DBR 104, the first cladding layer 106, the active region 108, the confinement layer 110, the second cladding layer 112 and the top contact layer 114. DBR FCSEL 100' also includes a lens 400. The lens 400 is formed on top of the beam exit window for beam collimation in order to form a more friendly beam profile of laser output 120' to be launched into a fiber optic cable. Lens 400 is formed of a polymide material. After depositing a polymide material on the top contact surface 114, the lens 400 is formed by thermal reflowing into the convex shape as illustrated.

DBR FCSEL 100' is a top emitting laser and in operation, it generates a laser beam steering element 101A, beam steering element 101B, narrow bandwith DBR 104, and the top contact layer 114. The interface 416 between the lens 400 and the top contact layer 114 acts as an output mirror and the narrow bandwith DBR 104 acts as a highly reflective end mirror for the DBR FCSEL 100'. From facet 101A, photons 120' of sufficient energy are emitted out the top of the DBR FCSEL 100' through the second cladding layer 112, the top contact layer 114, and the lens 400.

Referring now to FIGS. 5A and 5B, a DBR FCSEL 100", a third embodiment of the present invention is illustrated.

DBR FCSEL 100" includes a number of the elements of the first embodiment, DBR FCSEL 100. These elements include the beam steering elements 101A and 101B, the substrate 102, the first cladding layer 106, the active region 108, the confinement layer 110, the second cladding layer 112 and the top contact layer 114. DBR FCSEL 100" also includes a regular quarter wavelength stacked DBR 502 and a narrow bandwidth DBR 504. DBR FCSEL 100" is bottom emitting with the photons 120" being emitted out the bottom through the substrate 102. The DBR mirror 502 is a regular quarter wavelength stack DBR so as to provide transmission at the desired wavelength of emission of the photons 120'. The narrow bandwidth DBR 504 is deposited on top of the top contact layer 114 of the DBR FCSEL 100". The narrow bandwidth DBR 504 is similar to the narrow bandwidth DBR 104 but is deposited on top instead. The narrow bandwidth DBR 504 is formed of layers and thicknesses of dielectric materials to have the narrow bandwidth reflectivity response substantially as illustrated in FIG. 2.

A lens 506 can alternatively be formed on the bottom of the substrate 102 of the DBR VCSEL 100". The lens 506 is formed at the beam exit window on the bottom of the substrate 102 to provide for beam collimation of laser output 120" to launch into a fiber optic cable. Lens 506 is a semiconductor lens and in the preferred embodiment is formed of the semiconductor substrate materials 102. After depositing a polymide material on the bottom surface of the substrate 102 and reflowing, the lens 506 is formed by etching into the convex shape as illustrated.

Figure 6:
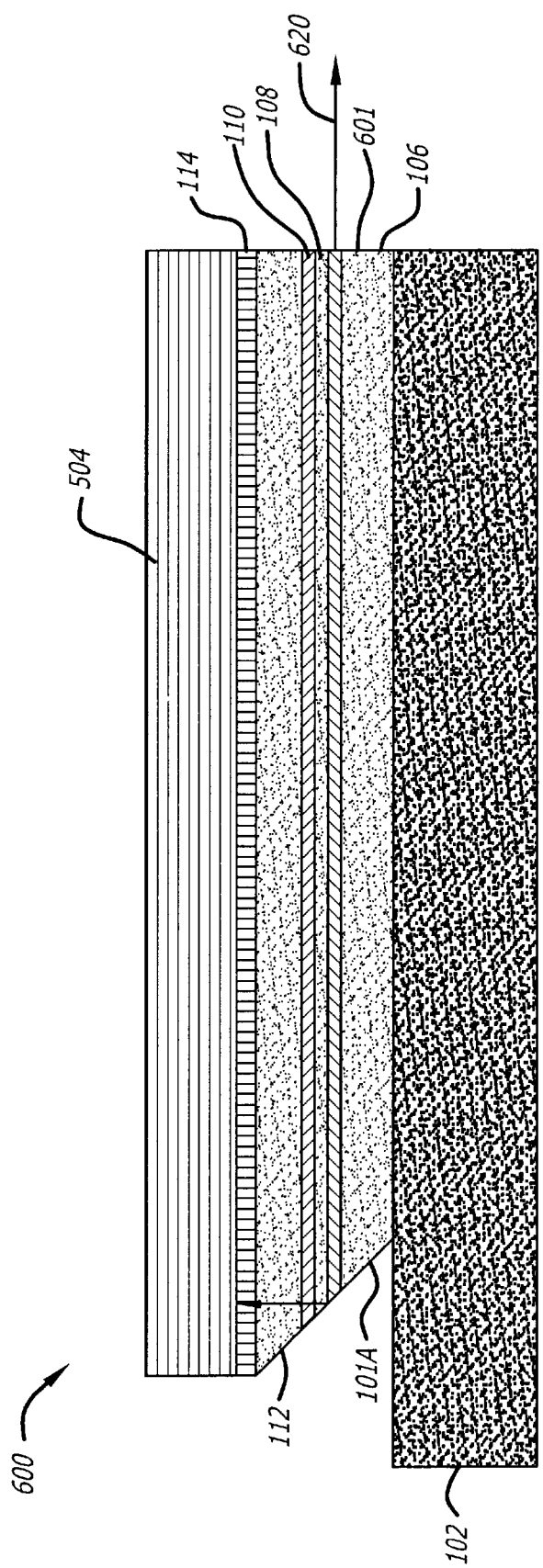
FIG. 6 is a magnified cross sectional side view of an DBR edge emitting laser for a fourth embodiment of the present invention.

Referring now to FIG. 6, a DBR edge emitting laser 600 for a fourth embodiment of the present invention is illustrated. DBR edge emitting laser 600 includes a number of the elements of the first embodiment, DBR FCSEL 100, including the beam steering element 101A, the substrate 102, the first cladding layer 106, the active region 108, the confinement layer 110, the second cladding layer 112 and the top contact layer 114. DBR edge emitting laser 600 includes the narrow bandwidth DBR 504 from DBR FCSEL 100" of FIG. 5 and a facet 601. The facet 601 is preferably at an angle of approximately ninety degrees with the incident light. The facet 601 can be formed by cleaving, etching, ion milling or other well known semiconductor process. While DBR edge emitting laser 600 is not a true FCSEL it retains the facet 101A of the DBR FCSEL 100. The DBR edge emitting laser 600 emits photons 620 out its edge through the facet 601. The wavelength of the output photons 620 of the laser 600 is dependent upon the design of the narrow bandwidth DBR mirror 504. The narrow bandwidth DBR 504 in the preferred embodiment has the narrow bandwidth reflectivity response substantially as illustrated in FIG. 2. The center wavelength 201 of the narrow bandwidth DBR 504 is designed to be 1.3 um or 1.55 um. The DBR 504 is deposited on top of the top contact layer 114 of the laser 600. Edge emitting lasers such as laser 600 are difficult to test when they are part of a wafer with multiple lasers thereon. However, the edge emitting laser 600 simplifies packaging and can be easily coupled with a silicon V-groove wafer board for passive coupling into an optical fiber.

The DBR FCSELs 100, 100', 100", and 100'" can be formed into a laser array with separate top side terminal contacts so as to be individually controlled if desired. The laser array shares the same substrate but has some of the upper layers on top of the substrate etched apart to form the individually controlled lasers.

Additionally, one or more narrow bandwith distributed Bragg reflectors can be generally used in any semiconductor laser. The semiconductor laser in this case would include the narrow bandwith distributed Bragg reflector and an active region. The narrow bandwith distributed Bragg reflector has a narrow wavelength range of a relatively high reflectivity response centered around a center wavelength in order to reflect photons having a wavelength within the narrow wavelength range. The active region of the semiconductor laser is formed to lase at a wavelength within the narrow wavelength range of the narrow bandwidth distributed Bragg reflector and couple photons into the narrow bandwidth distributed Bragg reflector. The narrow wavelength range of the narrow bandwidth distributed Bragg reflector is less than or equal to the cavity resonant mode spacing. The narrow bandwidth distributed Bragg reflector in one embodiment has a reflectivity response substantially as illustrated in FIG. 2.

The active region may have a first beam steering element to reflect photons between the active region and the narrow bandwidth distributed Bragg reflector and a second beam steering element to reflect photons from the active region through a top surface to emit photons out of the semiconductor laser. The active region may have a first facet substantially angled at forty-five degrees to the incident photons and a second facet substantially angled at ninety degrees to the incident photons to emit photons out an edge of the semiconductor laser.

In one embodiment, the narrow bandwidth distributed Bragg reflector is a semiconductor distributed Bragg reflector and is formed of pairs of semiconductor materials from the set Indium-Gallium-Arsenide-Phosphide (InGaAsP)/Indium-Phosphide (InP), Indium-Aluminum-Gallium-Arsenide (InAlGaAs)/Indium-Phosphide (InP), Gallium-Arsenide (GaAs)/Aluminum-Gallium-Arsenide (AlGaAs). In another embodiment of the semiconductor laser, the narrow bandwidth distributed Bragg reflector is a dielectric distributed Bragg reflector. In yet another embodiment of the semiconductor laser, the narrow bandwidth distributed Bragg reflector is formed of pairs of dielectric materials from the set of a silicon di-oxide ($SiO_2$) and a titanium di-oxide ($TiO_2$) pair and a silicon di-oxide ($SiO_2$) and silicon nitride di-oxide ($SiNO_2$) pair.

In one embodiment of the semiconductor laser, the active region is formed of at least one quantum well using Indium-Gallium-Arsenide-Phosphide (InGaAsP) or Indium-Aluminum-Gallium-Arsenide (InAlGaAs) quantum wells. In another embodiment of the semiconductor laser, the active region is formed of at least one quantum well using Indium-Gallium-Arsenide-Phosphide (InGaAsP) or Indium-Gallium-Arsenide (InGaAs) quantum wells.

In addition to the active region and the narrow bandwidth distributed Bragg reflector, the semiconductor laser may further include one or more elements of a substrate, a first cladding layer coupled to a top surface of the active region, a second cladding layer coupled to a bottom surface of the active region, and a contact layer. The semiconductor laser may additionally include a lens to focus the photons for launching into an optical fiber.

In one embodiment, the substrate may be an Indium-Phosphide (InP) substrate. In another embodiment, the substrate may be a Gallium Arsenide (GaAs) substrate. The second cladding layer of the semiconductor laser may include a confinement layer. The confinement layer in one embodiment may be a strained Indium-Aluminum-Arsenide (InAlAs) layer that can be oxidized laterally. The first and second cladding layers may be Indium-Gallium-Arsenide-Phosphide (InGaAsP) and have bandgaps wider than the bandgap of the active region.

The semiconductor laser with its active region and narrow bandwidth DBR can be formed in one embodiment to have a center wavelength of 1300 nanometers and a narrow wavelength range between 1275 nanometers to 1325 nanometers. In another embodiment, the semiconductor laser can be formed to have a center wavelength of 1550 nanometers and a narrow wavelength range between 1525 nanometers to 1575 nanometers.

In one embodiment, the semiconductor laser may be a VCSEL. In another embodiment, the semiconductor laser may be a FCSEL. In another embodiment, the semiconductor laser may be an edge emitting laser. In yet another embodiment, the semiconductor laser may be a bottom emitting laser further including a standard quarter-wavelength DBR.

The preferred embodiments of the present invention are thus described. While the present invention has been described in particular embodiments, the present invention should not be construed as limited by such embodiments, but rather construed according to the claims that follow below.

What is claimed is:

1. A folded cavity surface emitting laser (FCSEL) comprising:
    a narrow bandwidth distributed Bragg reflector having a narrow wavelength range of a relatively high reflectivity response centered around a center wavelength, the narrow bandwidth distributed Bragg reflector to reflect photons having a wavelength within the narrow wavelength range;
    an active region over the narrow bandwidth distributed Bragg reflector, the active region formed to lase and emit photons at a wavelength within the narrow wavelength range and couple photons into the narrow bandwidth distributed Bragg reflector, the active region having a first angled facet and a second angled facet at opposite ends to reflect photons therein; and
    the narrow bandwidth distributed Bragg reflector to reflect photons having the wavelength within the narrow wavelength range back into the active region for amplification.

2. The folded cavity surface emitting laser (FCSEL) of claim 1 wherein,
    the narrow wavelength range of the narrow bandwidth distributed Bragg reflector is less than or equal to the cavity resonant mode spacing.

3. The folded cavity surface emitting laser (FCSEL) of claim 1 wherein,
    the narrow bandwidth distributed Bragg reflector is a semiconductor distributed Bragg reflector formed of pairs of semiconductor materials from the set Indium-Gallium-Arsenide-Phosphide (InGaAsP)/Indium-Phosphide (InP), Indium-Aluminum-Gallium-Arsenide (InAlGaAs)/Indium-Phosphide (InP), Gallium-Arsenide (GaAs)/Aluminum-Gallium-Arsenide (AlGaAs).

4. The folded cavity surface emitting laser (FCSEL) of claim 1 wherein,
    the narrow bandwidth distributed Bragg reflector is a dielectric distributed Bragg reflector.

5. The folded cavity surface emitting laser (FCSEL) of claim 4 wherein,
    the narrow bandwidth distributed Bragg reflector is formed of pairs of dielectric materials from the set of a silicon di-oxide ($SiO_2$) and a titanium di-oxide ($TiO_2$) pair and a silicon di-oxide ($SiO_2$) and silicon nitride di-oxide ($SiNO_2$) pair.

6. The folded cavity surface emitting laser (FCSEL) of claim 1 further comprising:
    a substrate;
    a first cladding layer coupled to a top surface of the active region;
    a second cladding layer coupled to a bottom surface of the active region; and
    a contact layer.

7. The folded cavity surface emitting laser (FCSEL) of claim 6 wherein,
    the substrate is a InP substrate or a GaAs substrate.

8. The folded cavity surface emitting laser (FCSEL) of claim 6 wherein,
    the second cladding layer includes a confinement layer.

9. The folded cavity surface emitting laser (FCSEL) of claim 8 wherein,
    the confinement layer is a strained Indium-Aluminum-Arsenide (InAlAs) layer that can be oxidized laterally.

10. The folded cavity surface emitting laser (FCSEL) of claim 6 wherein,
    the first and second cladding layers are InGaAsP and have bandgaps wider than the bandgap of the active region.

11. The folded cavity surface emitting laser (FCSEL) of claim 1 further comprising:
    a lens to focus the photons for launching into an optical fiber.

12. The folded cavity surface emitting laser (FCSEL) of claim 1 wherein,
    the center wavelength is 1300 nanometers and the narrow wavelength range is 1275 nanometers to 1325 nanometers.

13. The folded cavity surface emitting laser (FCSEL) of claim 12 wherein,
    the active region is formed of at least one quantum well using InGaAsP or InAlGaAs quantum wells.

14. The folded cavity surface emitting laser (FCSEL) of claim 1 wherein,
    the center wavelength is 1550 nanometers and the narrow wavelength range is 1525 nanometers to 1575 nanometers.

15. The folded cavity surface emitting laser (FCSEL) of claim 14 wherein,
    the active region is formed of at least one quantum well using InGaAsP or InGaAs quantum wells.

16. The folded cavity surface emitting laser (FCSEL) of claim 1 wherein,
    the first angled facet and the second angled facet are parallel to each other, each having an angle of substantially forty-five degrees to the incident photons from the active region.

17. The folded cavity surface emitting laser (FCSEL) of claim 6 wherein,
    the first angled facet and the second angled facet extend through the first cladding layer, the second cladding layer the contact layer and a portion of the narrow bandwidth distributed Bragg reflector.

18. The folded cavity surface emitting laser (FCSEL) of claim 6 wherein,
    the FCSEL is a bottom emitting semiconductor laser and the FCSEL further comprises:
    a standard quarter-wavelength distributed Bragg reflector over the active region to reflect photons emitted from the active region back into the active region, and wherein,
        the narrow bandwidth distributed Bragg reflector further to emit photons of sufficient energy having the wavelength within the narrow wavelength range.

19. The folded cavity surface emitting laser (FCSEL) of claim 18 wherein, the first angled facet and the second angled facet extend through the first cladding layer, the second cladding layer, and a portion of the standard quarter-wavelength distributed Bragg reflector.

20. The folded cavity surface emitting laser (FCSEL) of claim 1 wherein, the narrow bandwidth distributed Bragg reflector has a reflectivity response substantially as illustrated in FIG. 2.

21. The folded cavity surface emitting laser (FCSEL) of claim 1 wherein, the narrow bandwidth distributed Bragg reflector to avoid reflecting photons having a wavelength outside the narrow wavelength range back into the active region.

22. A semiconductor laser comprising:

a narrow bandwidth distributed Bragg reflector having a narrow wavelength range of a relatively high reflectivity response centered around a center wavelength, the narrow bandwidth distributed Bragg reflector to reflect photons having a wavelength within the narrow wavelength range;

an active region over the narrow bandwidth distributed Bragg reflector, the active region formed to lase and emit photons at a wavelength within the narrow wavelength range and couple photons into the narrow bandwidth distributed Bragg reflector; and the narrow bandwidth distributed Bragg reflector to reflect photons having the wavelength within the narrow wavelength range back into the active region for amplification.

23. The semiconductor laser of claim 22 wherein, the narrow wavelength range of the narrow bandwidth distributed Bragg reflector is less than or equal to the cavity resonant mode spacing.

24. The semiconductor laser of claim 22 wherein, the active region has a first beam steering element to reflect photons between the active region and the narrow bandwidth distributed Bragg reflector.

25. The semiconductor laser of claim 24 wherein, the active region has a second beam steering element to reflect photons from the active region through a top surface to emit photons out of the semiconductor laser.

26. The semiconductor laser of claim 22 wherein, the active region has a first facet substantially angled at forty-five degrees to the incident photons and a second facet substantially angled at ninety degrees to the incident photons to emit photons out an edge of the semiconductor laser.

27. The semiconductor laser of claim 22 wherein, the narrow bandwidth distributed Bragg reflector is a semiconductor distributed Bragg reflector formed of pairs of semiconductor materials from the set Indium-Gallium-Arsenide-Phosphide (InGaAsP)/Indium-Phosphide (InP), Indium-Aluminum-Gallium-Arsenide (InAlGaAs)/Indium-Phosphide (InP), Gallium-Arsenide (GaAs)/Aluminum-Gallium-Arsenide-Arsenide (AlGaAs).

28. The semiconductor laser of claim 22 wherein, the narrow bandwidth distributed Bragg reflector is a dielectric distributed Bragg reflector.

29. The semiconductor laser of claim 28 wherein, the narrow bandwidth distributed Bragg reflector is formed of pairs of dielectric materials from the set of a silicon di-oxide ($SiO_2$) and a titanium di-oxide ($TiO_2$) pair and a silicon di-oxide ($SiO_2$) and silicon nitride di-oxide ($SiNO_2$) pair.

30. The semiconductor laser of claim 22 further comprising:

a substrate;

a first cladding layer coupled to a top surface of the active region;

a second cladding layer coupled to a bottom surface of the active region; and a contact layer.

31. The semiconductor laser of claim 30 wherein, the substrate is an InP substrate or a GaAs substrate.

32. The semiconductor laser of claim 30 wherein, the second cladding layer includes a confinement layer.

33. The semiconductor laser of claim 32 wherein, the confinement layer is a strained Indium-Aluminum-Arsenide (InAlAs) layer that can be oxidized laterally.

34. The semiconductor laser of claim 30 wherein, the first and second cladding layers are InGaAsP and have bandgaps wider than the bandgap of the active region.

35. The semiconductor laser of claim 30 further comprising:

a lens to focus the photons for launching into an optical fiber.

36. The semiconductor laser of claim 22 wherein, the center wavelength is 1300 nanometers and the narrow wavelength range is 1275 nanometers to 1325 nanometers.

37. The semiconductor laser of claim 36 wherein, the active region is formed of at least one quantum well using InGaAsP or InAlGaAs quantum wells.

38. The semiconductor laser of claim 22 wherein, the center wavelength is 1550 nanometers and the narrow wavelength range is 1525 nanometers to 1575 nanometers.

39. The semiconductor laser of claim 38 wherein, the active region is formed of at least one quantum well using InGaAsP or InGaAs quantum wells.

40. The semiconductor laser of claim 22 wherein, the semiconductor laser is a bottom emitting laser further comprising:

a standard quarter-wavelength distributed Bragg reflector over the active region to reflect photons emitted from the active region back into the active region, and wherein, the narrow bandwidth distributed Bragg reflector further to emit photons of sufficient energy having the wavelength within the narrow wavelength range.

41. The semiconductor laser of claim 22 wherein, the narrow bandwidth distributed Bragg reflector has a reflectivity response substantially as illustrated in FIG. 2.

42. The semiconductor laser of claim 22 wherein, the narrow bandwidth distributed Bragg reflector to avoid reflecting photons having a wavelength outside the narrow wavelength range back into the active region.

43. An edge emitting semiconductor laser comprising:

a narrow bandwidth distributed Bragg reflector having a narrow wavelength range of a relatively high reflectivity response centered around a center wavelength, the narrow bandwidth distributed Bragg reflector to reflect photons having a wavelength within the narrow wavelength range;

an active region over the narrow bandwidth distributed Bragg reflector, the active region formed to lase and emit photons at a wavelength within the narrow wavelength range and couple photons into the narrow bandwidth distributed Bragg reflector, the active region having a forty five degree angle facet at one end for reflection and a straight facet at another end to emit photons from the active region on an edge of the edge emitting laser; and the narrow bandwidth distributed Bragg reflector to reflect photons having the wavelength within the narrow wavelength range back into the active region for amplification.

44. The edge emitting semiconductor laser of claim 43 wherein, the narrow wavelength range of the narrow bandwidth distributed Bragg reflector is less than or equal to the cavity resonant mode spacing.

45. The edge emitting semiconductor laser of claim 43 wherein, the active region is an InGaAsP quantum well.

46. The edge emitting semiconductor laser of claim 43 wherein, the active region is an InAlGaAs quantum well.

47. The edge emitting semiconductor laser of claim 43 wherein, the active region is a multiple quantum well structure formed of InGaAsP quantum wells.

48. The edge emitting semiconductor laser of claim 43 wherein, the active region is a multiple quantum well structure formed of InAlGaAs quantum wells.

49. The edge emitting semiconductor laser of claim 43 wherein, the narrow bandwidth distributed Bragg reflector is a semiconductor distributed Bragg reflector formed of pairs of semiconductor materials from the set Indium-Gallium-Arsenide-Phosphide (InGaAsP)/Indium-Phosphide (InP), Indium-Aluminum-Gallium-Arsenide (InAlGaAs)/Indium-Phosphide (InP), Gallium-Arsenide (GaAs)/Aluminum-Gallium-Arsenide (AlGaAs).

50. The edge emitting semiconductor laser of claim 43 wherein, the narrow bandwidth distributed Bragg reflector is a dielectric distributed Bragg reflector.

51. The edge emitting semiconductor laser of claim 50 wherein, the narrow bandwidth distributed Bragg reflector is formed of pairs of dielectric materials from the set of a silicon di-oxide ($SiO_2$) and a titanium di-oxide ($TiO_2$) pair and a silicon di-oxide ($SiO_2$) and silicon nitride di-oxide ($SiNO_2$) pair.

52. The edge emitting semiconductor laser of claim 43 further comprising:

a substrate;

a first cladding layer coupled to a top surface of the active region;

a second cladding layer coupled to a bottom surface of the active region; and a contact layer.

53. The edge emitting semiconductor laser of claim 52 wherein, the substrate is a InP substrate or a GaAs substrate.

54. The edge emitting semiconductor laser of claim 52 wherein, the second cladding layer includes a confinement layer.

55. The edge emitting semiconductor laser of claim 54 wherein, the confinement layer is a strained Indium-Aluminum-Arsenide (InAlAs) layer that can be oxidized laterally during process.

56. The edge-emitting semiconductor laser of claim 52 wherein, the first and second cladding layers are InGaAsP and have bandgaps wider than the bandgap of the active region.

57. The edge emitting semiconductor laser of claim 52 wherein, the first angled facet extends through the first cladding layer and the second cladding layer.

58. The edge emitting semiconductor laser of claim 43 wherein, the center wavelength is 1300 nanometers and the narrow wavelength range is 1275 nanometers to 1325 nanometers.

59. The edge emitting semiconductor laser of claim 58 wherein, the active region is formed of at least one quantum well using InGaAsP or InAlGaAs quantum wells.

60. The edge emitting semiconductor laser of claim 43 wherein, the center wavelength is 1550 nanometers and the narrow wavelength range is 1525 nanometers to 1575 nanometers.

61. The edge emitting semiconductor laser of claim 60 wherein, the active region is formed of at least one quantum well using InGaAsP or InGaAs quantum wells.

62. The edge emitting semiconductor laser of claim 43 wherein, the narrow bandwidth distributed Bragg reflector has a reflectivity response substantially as illustrated in FIG. 2.

63. The edge emitting laser of claim 43 wherein, the narrow bandwidth distributed Bragg reflector to avoid reflecting photons having a wavelength outside the narrow wavelength range back into the active region.

64. A method of lasing in a semiconductor laser, the method comprising:

electrically exciting the semiconductor laser to generate a plurality of photons over varying wavelengths in a laser cavity;

steering the plurality of photons into a narrow bandwidth distributed Bragg reflector, the narrow bandwidth distributed Bragg reflector adjacent to the laser cavity;

reflecting photons having a wavelength in a narrow wavelength range of the narrow distributed Bragg reflector back into the laser cavity; and emitting the photons having the wavelength in the narrow wavelength range out from the semiconductor laser.

65. The method of claim 64 further comprising:

prior to emitting the photons having the wavelength in the narrow wavelength range out from the semiconductor laser, steering the plurality of photons having the wavelength in the narrow wavelength range toward an emitting surface.

66. The method of claim 64 further comprising:

avoiding the reflection of photons having a wavelength outside the narrow wavelength range back into the active region.

67. A fiber optic communication system for transceiving information over optical fibers, the fiber optic communication system including:

a semiconductor laser, the semiconductor laser having,
a narrow bandwidth distributed Bragg reflector having a narrow wavelength range of a relatively high reflectivity response centered around a center wavelength, the narrow bandwidth distributed Bragg reflector to reflect photons having a wavelength within the narrow wavelength range;
an active region over the narrow bandwidth distributed Bragg reflector, the active region formed to lase and emit photons at a wavelength within the narrow wavelength range and couple photons into the narrow bandwidth distributed Bragg reflector; and
the narrow bandwidth distributed Bragg reflector to reflect photons having the wavelength within the narrow wavelength range back into the active region for amplification.

68. The fiber optic communication system of claim 67 for transceiving information over optical fibers, wherein, the semiconductor laser is modulated to generate a signal by modulating photons.

69. The fiber optic communication system of claim 68 transceiving information over optical fibers, wherein, the semiconductor laser is modulated to generate a signal by an external modulator.

70. The fiber optic communication system of claim 67 for transceiving information over optical fibers, wherein, the narrow bandwidth distributed Bragg reflector of the semiconductor laser to avoid reflecting photons having a wavelength outside the narrow wavelength range back into the active region.

71. A semiconductor laser comprising:

an active region having one or more quantum wells, the active region to lase and emit photons;

a plurality of semiconductor material layers coupled together to form a first distributed Bragg reflector having a narrow wavelength range of a relatively high reflectivity response centered around a center wavelength, the first distributed Bragg reflector adjacent to a first side of the active region to receive photons, the first distributed Bragg reflector to reflect photons having a wavelength within the narrow wavelength range back into the active region for amplification.

72. The semiconductor laser of claim 71 wherein, the narrow wavelength range of the first bandwidth distributed Bragg reflector is less than or equal to the cavity resonant mode spacing.

73. The semiconductor laser of claim 71 wherein, the narrow bandwidth distributed Bragg reflector to avoid reflecting photons having a wavelength outside the narrow wavelength range back into the active region.

74. The semiconductor laser of claim 71 wherein the plurality of semiconductor material layers are pairs of semiconductor materials from the set of Indium-Gallium-Arsenide-Phosphide (InGaAsP)/Indium-Phosphide (InP), Indium-Aluminum-Gallium-Arsenide (InAlGaAs)/Indium-Phosphide (InP), and Gallium-Arsenide (GaAs)/Aluminum-Gallium-Arsenide (AlGaAs).

75. The semiconductor laser of claim 71 wherein the plurality of semiconductor material layers are dielectric materials.

76. The semiconductor laser of claim 75 wherein the plurality of semiconductor material layers are pairs of dielectric materials from the set of a silicon di-oxide ($SiO_2$) and a titanium di-oxide ($TiO_2$) pair, and a silicon di-oxide ($SiO_2$) and silicon nitride di-oxide ($SiNO_2$) pair.

77. The semiconductor laser of claim 71 further comprising:

a substrate;

a first cladding layer coupled to a top surface of the active region;

a second cladding layer coupled to a bottom surface of, the active region; and a contact layer.

78. The semiconductor laser of claim 77 wherein, the second cladding layer includes a confinement layer.

79. The semiconductor laser of claim 71 further comprising:

a second distributed Bragg reflector adjacent to a second side of the active region to receive photons, the second distributed Bragg reflector to reflect photons back into the active region for amplification.

80. The semiconductor laser of claim 79 further comprising:

a lens to focus the photons for launching into an optical fiber.

81. The semiconductor laser of claim 71 wherein, the first distributed Bragg reflector further to emit photons of sufficient energy having the wavelength within the narrow wavelength range.

\* \* \* \* \*